United States Patent
Suzuki

[11] Patent Number: 5,905,948
[45] Date of Patent: May 18, 1999

[54] HIGH FREQUENCY CHANNEL SELECTING CIRCUIT FOR RADIO RECEIVER AND METHOD OF MANUFACTURING TUNING CIRCUITS THEREFOR

[75] Inventor: Yukio Suzuki, Tsurugashima, Japan

[73] Assignee: Toko Kabushiki Kaisha, Tokyo-to, Japan

[21] Appl. No.: 08/686,390

[22] Filed: Jul. 25, 1996

[30] Foreign Application Priority Data

Jul. 25, 1995 [JP] Japan .................................... 7-209213

[51] Int. Cl.[6] ..................................................... H04B 1/16
[52] U.S. Cl. .................................. 455/193.1; 455/191.1; 455/191.2; 455/150.1; 455/178.1; 455/187.1
[58] Field of Search ............................ 455/150.1, 178.1, 455/179.1, 180.1–180.4, 187.1, 188.1–188.2, 189.1, 191.1–191.2, 193.2, 193.1, 197.1–197.2

[56] References Cited

U.S. PATENT DOCUMENTS

| | | | |
|---|---|---|---|
| 4,271,529 | 6/1981 | Strammello, Jr. ................... | 455/180.4 |
| 4,399,559 | 8/1983 | Theriault ............................. | 455/197.1 |
| 4,691,378 | 9/1987 | Kumamoto et al. ................. | 455/191.1 |
| 4,725,805 | 2/1988 | Takada ................................. | 336/83 |
| 4,742,569 | 5/1988 | Yokoyama et al. ................. | 455/193.3 |
| 4,760,535 | 7/1988 | Englmeier ........................... | 455/197.1 |
| 4,837,852 | 6/1989 | Takada et al. ...................... | 455/193.3 |
| 5,203,031 | 4/1993 | Sugayama ........................... | 455/182.1 |
| 5,263,183 | 11/1993 | Owen ................................. | 455/150.1 |
| 5,428,829 | 6/1995 | Osburn et al. ...................... | 455/193.2 |
| 5,678,212 | 10/1997 | Sakai et al. ........................ | 455/193.3 |

FOREIGN PATENT DOCUMENTS

| | | | |
|---|---|---|---|
| 3707839 | 9/1987 | Germany ........................ | H03J 3/18 |
| 3-145339 | 6/1991 | Japan .............................. | H04B 1/18 |

OTHER PUBLICATIONS

Patent Abstracts of Japan, E–854, Dec. 5, 1989, vol. 13/No. 541.
Translation of Office Action issued on Feb. 12, 1998.

Primary Examiner—Bryan Tung
Assistant Examiner—Vu Le
Attorney, Agent, or Firm—Pillsbury Madison & Sutro

[57] ABSTRACT

A therefor method of manufacturing tuning circuits for constituting a high frequency channel selecting circuit for a radio receiver. The method can eliminate the complicated coil inductance adjustment for tracking on the circuit board, so that the circuit elements can be arranged freely without any interference between the tuning circuits. The variable capacitance diodes (D1, D2; D3, D4; D5, D6) and fixed capacitances (C1; C4; C7) are classified; a fixed capacitance is selected according to a ranking of capacitance value of the variable capacitance diodes, to obtain a variable capacitance range or a ratio ($C_{max}/C_{min}$) determined for each tuning circuit; and the inductance of a coil (L1; L2; L3) of each tuning circuit is adjusted in such a way that tracking error can be eliminated on the basis of one common tuning voltage, before the tuning circuits are mounted on the circuit board.

9 Claims, 3 Drawing Sheets

HIGH FREQUENCY CHANNEL SELECTING CIRCUIT FOR RADIO RECEIVER AND METHOD OF MANUFACTURING TUNING CIRCUITS THEREFOR

BACKGROUND OF THE INVENTION

1. Field of the Invention

The present invention relates to a high frequency channel selecting circuit for a radio receiver and a method of manufacturing three tuning circuits for constituting the selecting circuit. This method is particularly suitable for a radio receiver, because inductance adjustment for tracking effected on a circuit board can be eliminated.

2. Description of the Prior Art

In a radio receiver of electronic tuning system, a high frequency channel selecting circuit is composed of an antenna tuning circuit, a high frequency tuning circuit and a local oscillation tuning circuit, and each tuning circuit is formed usually by use of a coil, two variable capacitance diodes, and a capacitor.

Therefore, when the channel selecting circuit as described above is formed on a circuit board of a radio receiver by use of discrete circuit elements, the inductance of each coil for forming each tuning circuit is previously adjusted at a central position of the variable range, and further, after the discrete circuit elements have been all mounted on the circuit board, the tracking adjustment is effected again.

In this tracking adjustment, the inductance of an oscillation coil is adjusted in such a way that a lower limit oscillation frequency of the local oscillation tuning circuit can be obtained at the lower limit tuning voltage of the variable capacitance diode and further, after that, the inductances of the antenna tuning circuit and the high frequency tuning circuit are both adjusted in such a way that the audio output can be maximized at a frequency referred to as a tracking point on the low band side of the received frequencies.

Further, there exists such a case that trimmer capacitors of both the antenna tuning circuit and the high frequency tuning circuits are adjusted in such a way that the audio output can be maximized at a high band side tacking point.

When the channel selecting circuit is formed on the circuit board by use of discrete circuit elements as described above, the three coils of the three tuning circuits must be adjusted three times or more at different frequencies respectively, in addition to the coil adjustments effected before the coils are mounted on the circuit board.

Therefore, when the trimmer capacitors are additionally adjusted, since the trimmer capacitors must be adjusted reciprocatingly between the low band side tracking point and the high band side tracking point, the coil inductances must be adjusted on the circuit board as large as seven to nine times.

In order to reduce the number of times of adjustments of the circuit elements on the circuit board, the antenna tuning circuit, the high frequency tuning circuit and the local oscillation tuning circuit are sometimes all assembled as a single block, and the tracking adjustment is effected under the same conditions as being mounted on the circuit board of the radio receiver, in order to eliminate the adjustment on the circuit board.

However, when the entire channel selecting circuit is assembled as a block, since the number of circuit elements to be assembled in the block increases and thereby since the circuit board on which the number of the circuit elements to be connected in the block increases, the cost of the selecting circuit is inevitably costly.

In addition, since the antenna tuning circuit, the high frequency tuning circuit and the local oscillation tuning circuit are all arranged close to each other on the circuit board, when the radio frequency becomes high as with the case of an FM radio receiver, the influence of radiation from the local oscillation tuning circuit becomes serious. Therefore, in order to prevent the mutual interference between the tuning circuits within the block, the circuit must be designed carefully, under due consideration of various restrictions in arrangement of the circuit elements and the wiring pattern.

SUMMARY OF THE INVENTION

With these problems in mind, therefore, it is the object of the present invention to provide a high frequency channel selecting circuit and a method of manufacturing three tuning circuits for constituting the channel selecting circuit, which can eliminate the tracking adjustment of the coil inductances on the circuit board of a radio receiver and further which can reduce various restrictions in arrangement of the circuit elements and on interference between the circuit elements.

Further, the other object of the present invention is to provide a high frequency channel selecting circuit, which can reduce the tracking error and thereby facilitate the tracking adjustment even if there exists a dispersion in the characteristics of the variable capacitance diodes.

To achieve the above-mentioned object, the present invention provides a high frequency channel selecting circuit for a radio receiver, having an antenna tuning circuit, a high frequency tuning circuit, and a local oscillation tuning circuit, wherein: the three tuning circuits each composed of a coil, at least one variable capacitance diode, and a fixed capacitance are formed as a block for each tuning circuit and mounted on the same circuit board; in each tuning circuit, an inductance of the coil is adjusted in such a way that tracking error can be eliminated when at least one common tuning voltage is applied to the variable capacitance diode; and a capacitance value of the fixed capacitance housed in the block of the same tuning circuit is determined so as to differ according to a ranking of the capacitance value of a variable capacitance diode in such a way that a variable capacitance range determined for each tuning circuit block can be obtained.

In the high frequency channel selecting circuit, it is preferable that the respective tuning circuit blocks are controlled on the basis of a single common tuning voltage in a reception band of the radio receiver.

Further, it is also preferable that the antenna tuning circuit block and the high frequency tuning circuit block are both controlled on the basis of the two tuning voltages different from the tuning voltage applied to the local oscillation tuning circuit block, the two tuning voltages being obtainable through two correcting circuits controlled by a microcomputer, respectively in a reception band of the radio receiver.

Here, the variable capacitance range determined for each tuning circuit block is a variable capacitance ratio of the maximum capacitance value to the minimum capacitance value of the tuning circuit block. Further, the maximum capacitance value of the tuning circuit block is an addition of a maximum capacitance value of the variable capacitance diode and a capacitance value of the fixed capacitance, and the minimum capacitance value of the tuning circuit block is an addition of a minimum capacitance value of the variable capacitance diode and the capacitance value of the fixed capacitance.

Further, the present invention provides a method of manufacturing an antenna tuning circuit, a high frequency tuning circuit, and a local oscillation tuning circuit all for constituting a high frequency channel selecting circuit for a radio receiver, in such a way that each tuning circuit is formed as a block by use of a coil, at least one variable capacitance diode, and a fixed capacitance, which comprises the steps of: classifying variable capacitance diodes and fixed capacitances; selecting a fixed capacitance according to a ranking of capacitance value of the variable capacitance diode, to obtain a variable capacitance range determined for each tuning circuit; and adjusting a coil inductance of each tuning circuit in such a way that tracking error can be eliminated on the basis of one common tuning voltage.

In the channel selecting circuit according to the present invention, since the antenna tuning circuit, the high frequency tuning circuit and the local oscillation tuning circuit are all formed as a single block, respectively and thereby since the distance between two of these three tuning circuits can be determined freely, it is possible to prevent the mutual interference among these tuning circuits. In addition, since the restriction in arrangement of the circuit elements is not required to be considered, the degree of design freedom of the radio receiver can be increased.

Further, since the fixed capacitance is selected according to the ranking of the variable capacitance diodes, it is possible to obtain a predetermined variable capacitance range for each tuning circuit.

Further, since the tracking adjustment by the coil of each tuning circuit is effected on the basis of one common tuning voltage before the circuit elements are mounted on the circuit board of the radio receiver, it is unnecessary to adjust the tracking of the channel selecting circuit after the respective tuning circuits have been mounted on the circuit board, with the result that the number of coil inductance adjustments can be reduced extremely.

DETAILED DESCRIPTION OF THE PREFERRED EMBODIMENTS

Figure 1:
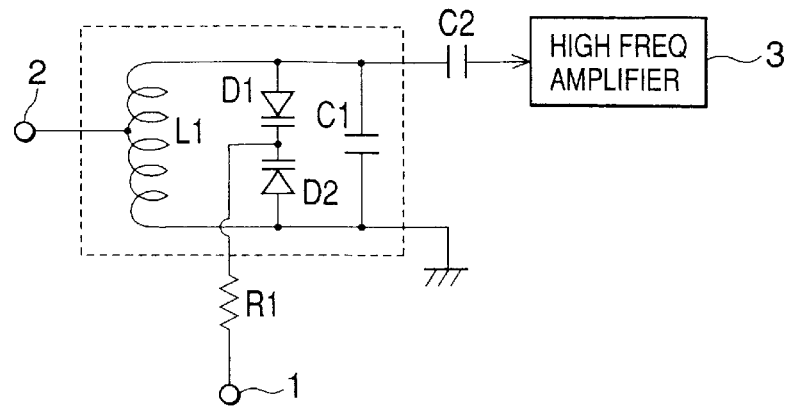
FIG. 1 is a circuit diagram showing an embodiment of an antenna tuning circuit of a high frequency channel selecting circuit of a radio receiver according to the present invention.
Figure 2:
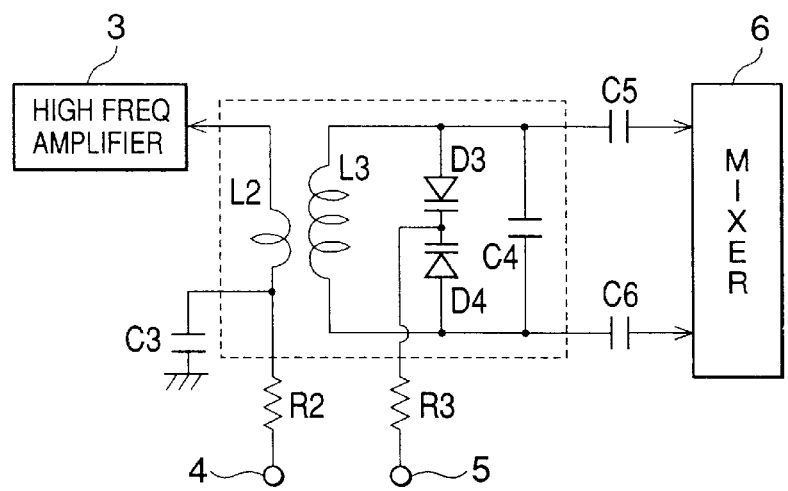
FIG. 2 is a circuit diagram showing an embodiment of a high frequency tuning circuit of the high frequency channel selecting circuit of the radio receiver according to the present invention.
Figure 3:
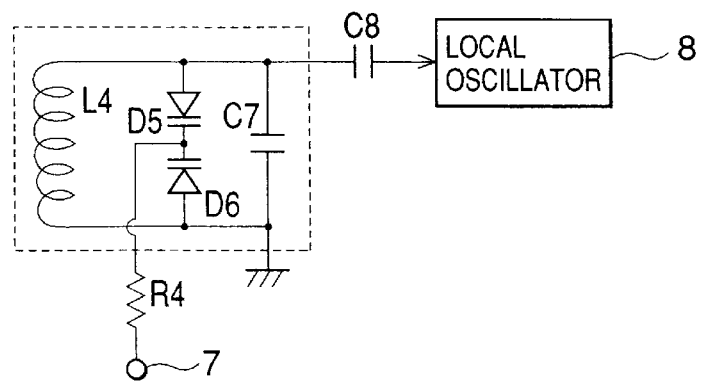
FIG. 3 is a circuit diagram showing an embodiment of a local oscillation tuning circuit of the high frequency channel selecting circuit of the radio receiver according to the present invention.
Figure 4:
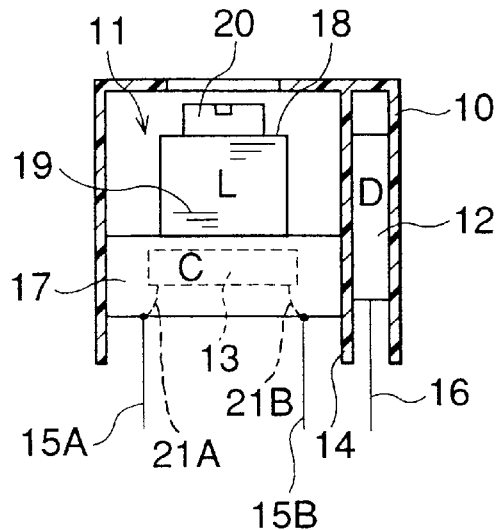
FIG. 4 is a cross-sectional view showing a physical construction of each of the respective tuning circuits for constituting the channel selecting circuit of the radio receiver according to the present invention.

An embodiment of the high frequency channel selecting circuit for a radio receiver according to the present invention will be described hereinbelow with reference to the attached drawings. FIGS. 1 to 3 are circuit diagrams showing three tuning circuits, and FIG. 4 is a cross-sectional view showing each tuning circuit.

FIG. 1 shows an antenna tuning circuit for constituting the high frequency channel selecting circuit. In FIG. 1, two series-connected variable capacitance diodes D1 and D2 and a fixed capacitance C1 are connected in parallel to each other between both ends of an antennal coil L1.

Two cathodes of the two variable capacitance diodes D1 and D2 are connected to each other, and a junction point between the two diodes D1 and D2 is connected to a terminal 1 via a resistor R1. A tuning voltage is applied to the two variable capacitance diodes D1 and D2 through this terminal 1. Further, an antenna input is applied to a tap of the coil L1 through a terminal 2. Further, one end of the coil L1 is connected to a high frequency amplifier circuit 3 via a coupling capacitor C2, and the other end of the coil L1 is grounded. In FIG. 1, a portion enclosed by dashed lines is formed integral with each other as a single block.

FIG. 2 shows a high frequency tuning circuit. In FIG. 2, one end of a primary coil L2 of a tuning transformer is connected to the high frequency amplifier circuit 3, and the other end thereof is grounded via a capacitor C3 and further connected to a terminal 4 via a resistance R2. A bias voltage is applied to the terminal 4.

Two series-connected variable capacitance diodes D3 and D4 and a fixed capacitance C4 are connected in parallel to each other between two ends of a secondary coil L3 of the tuning transformer.

Two cathodes of the two variable capacitance diodes D3 and D4 are connected to each other, and a junction point between the two diodes D3 and D4 is connected to a terminal 5 via a resistor R3. A tuning voltage is applied to the two variable capacitance diodes D3 and D4 through this terminal 5. Further, both ends of the coil L3 are connected to a mixing circuit 6 via two capacitors C5 and C6, respectively. In FIG. 2, a portion enclosed by dashed lines is formed integral with each other as a single block.

FIG. 3 shows a local oscillation tuning circuit for constituting the high frequency channel selecting circuit. In FIG. 3, two series-connected variable capacitance diodes D5 and D6 and a fixed capacitance C7 are connected in parallel to each other between both ends of an oscillation coil L4.

Two cathodes of the two variable capacitance diodes D5 and D6 are connected to each other, and a junction point between the two diodes D5 and D6 is connected to a terminal 7 via a resistor R4. A tuning voltage is applied to the two variable capacitance diodes D5 and D6 through this terminal 7. Further, one end of the oscillation coil L4 is connected to a local oscillation circuit 8 via a coupling capacitor C8. In FIG. 3, a portion enclosed by dashed lines is formed integral with each other as a single block.

As described above, the three tuning circuits for constituting the channel selecting circuit are assembled as a block for each tuning circuit.

Further, in each tuning circuit, each capacitance value of the fixed capacitance C1, C4 or C7 is selected according to the ranking of the variable capacitance diodes in such a way that each variable range of the capacitance value determined for each tuning circuit (i.e., the variable capacitance ratio of the minimum value $C_{max}$ to the maximum value $C_{min}$) can be obtained. Further, the three tuning circuits are mounted on the same circuit board. Further, although the resistor or resistors connected to each tuning circuit are not directly related to the tracking adjustment, the resistor can be assembled in each tuning circuit block in order to increase the integration density.

FIG. 4 is a cross-sectional view showing the physical construction of each tuning circuit assembled as a single block, which can be applied in common for the three tuning circuits, respectively.

In FIG. 4, a coil 11, two variable capacitance diodes 12 and a fixed capacitance 13 are all housed in a casing 10 formed of a synthetic resin 10. Further, the casing 10 is partitioned by an inner wall 14 to separate the coil 11 from the two variable capacitance diodes 12. Further, in FIG. 4, the reference numerals 15A and 15B denote two end terminals of the coil 11 or the fixed capacitance 13; and 16 denotes a terminal of the two variable capacitance diodes 12.

The coil 11 is formed by winding a wire material 19 around a bobbin 18 mounted on a plastic base 17, and further both ends of the wire material 19 are connected to two terminals 15A and 15B formed on the lower side of the base 17. The fixed capacitance 13 is formed within the base 17, and two leads 21A and 21B are connected to the two terminals 15A and 15B, respectively. This method of forming the fixed capacitance 13 within the base 17 is well known in the art. Further, a threaded core 20 is attached to the top of the bobbin 18, so that each coil inductance can be adjusted by rotating this threaded core 20 into or out of the coil 11.

The circuit elements arranged within the block (excluding the coil 11 and the fixed capacitance 13 both easy to connect) are connected to the wiring pattern formed on a circuit board, when the block is mounted on the board or a circuit board. As described above, in this embodiment, since the circuit elements are fixed to the inner side of the casing 10 when inserted into the casing 10 (which is different from the prior art method), the circuit board is not used to assemble the circuit elements into a block.

Further, FIG. 4 shows one block construction by way of example. Without being limited only thereto, it is possible to house only the coil inside the casing and to fix the variable capacitance diodes on the outside surface of the casing. Further, the casing 10 can be formed of a metal. Further, it is also possible to house the coil covered with a metal and the variable capacitance diodes together within a casing formed of a synthetic resin, as a single block.

In the above description, in the case of the antenna tuning circuit, it is apparent that the coil 11 corresponds to the antenna coil L1; the variable capacitance diodes 12 correspond to the two variable capacitance diodes D1 and D2; and the fixed capacitance 13 corresponds to the fixed capacitance C1, respectively.

Each of the tuning circuits for construction the high frequency channel selecting circuit can be manufactured by effecting the following tracking adjustment. To facilitate understanding of the tracking adjustment, the method of manufacturing the tuning circuit empirically will be first described.

First, the antenna tuning circuit, the high frequency tuning circuit and the local oscillation tuning circuit all assembled as a block, respectively are mounted on an adjusting board to effect the tracking adjustment. Further, all the respective circuit elements housed in the respective blocks are connected to each other via the wiring pattern formed on the adjusting board.

Further, the common tuning voltage is fixed at a point in a voltage range in which the received frequencies can be covered. The fixed common tuning voltage is applied to the antenna tuning circuit, the high frequency tuning circuit and the local oscillation tuning circuit, respectively. Under these conditions, the inductances of the coils L1 and L3 are both adjusted in such a way that the antennal tuning circuit and the high frequency tuning circuit can be tuned to the received frequency. Further, in the case of the local oscillation tuning circuit of lower side heterodyne system, the inductance of the oscillation coil L4 is adjusted in such a way that the tuning circuit can be tuned to a difference frequency between the received frequency and the intermediate frequency. As described above, in the present embodiment, the three tuning circuits are adjusted on the basis of one common tuning voltage so that a tracking error will not occur.

It is preferable that the received frequency to be tuned to on the basis of the common tuning voltage is set below the center of the reception band. For instance, in the case of Japan, since the reception band of the FM broadcasting lies between 76 and 90 MHz, when the radio receiver is so designed that this reception band can be covered by the tuning voltage between 1.2 and 7V and further when 78 MHz can be received at 1.5V, the antenna tuning circuit and the high frequency tuning circuit are both tuned to 78 MHz and the local oscillation tuning circuit is tuned to 67.3 MHz (=78–10.7 MHz).

When the respective tuning circuits are tuned on the basis of one common tuning voltage, if there exists a fixed capacitance or a stray capacitance which exerts a harmful influence upon the tuned frequency on the circuit board of the radio receiver, it is necessary to realize the same condition as with the case of the circuit board, on the adjusting board by connecting a correction capacitor on the adjusting board, for instance.

In any cases, since the tracking adjustment can be effected for the respective tuning circuits on the basis of one common tuning voltage, it is possible to assure the matching between the respective tuning circuits at this common tuning voltage.

In other words, when a first set, a second set and a third set of the antenna tuning circuit, the high frequency tuning circuit and the local oscillation tuning circuit are adjusted for tracking, respectively, it is possible to assure the matching among the first, second and third tuning circuits whenever the high frequency channel selecting circuit is formed on the same circuit board by assembling any one of a plurality of sets of the three tuning circuits.

Therefore, when the channel selecting circuit already tracking-adjusted on the adjusting board is further mounted and assembled with the other circuit elements on the circuit board of a radio receiver, an additional coil adjustment is no more necessary.

Further, the respective tuning circuits are not necessarily adjusted after having been assembled. That is, it is possible to adjust the respective tuning circuits independently or separately on the basis of one common tuning voltage, as far as the tracking error will not occur at the common voltage of 1.5V, for instance.

However, there exists the case where a large tracking error occur at a tuning voltage other than the common tuning voltage. This is caused by a dispersion in characteristics of the variable capacitance diodes. To overcome this problem, that is, to uniformalize the characteristics of the variable capacitance diodes, in general, the variable capacitance diodes are sold by dividing the characteristics thereof into a plurality of ranks in each of which the diodes having approximately the same capacitance values are selected. In this ranking, the capacitance values obtained when a specific tuning voltage is applied are classified into four or five sorts.

For instance, in the case of the variable capacitance diodes of No. KV1410 manufactured and soled by the same Applicant, the variable capacitance diodes usable in a tuning voltage range from 2 to 8V are classified into four sorts as follows: the first rank of the capacitance value at a tuning voltage of 2V is between 41.33 and 42.59 PF; the second rank thereof is between 42.49 and 43.79 PF; the third rank thereof is between 43.69 and 45.02 PF; and the fourth rank thereof is between 44.92 and 46.29 PF. Further, the above-mentioned capacitance value is a value obtained when two variable capacitance diodes are connected in series as shown in FIGS. 1 to 3.

In the case of the diode capacitance range at a tuning voltage of 4V, 6V or 8V, the diodes are classified into four sorts in the same way as above.

Accordingly, there exists such the case where the same variable capacitance diode is classified as follows: the first rank at 2V; the third rank at 4V; the second at 6V; and the second rank at 8V. In this case, this diode is put on the market by attaching such a ranking mark as Ranks: [1-3-2-2], for instance.

The variable capacitance diodes classified into the same rank are packed up in the same package, and then shipped to a customer as the variable capacitance diodes whose characteristics are uniformarized in a capacitance range between the upper limit and the lower limit of the tuning voltage.

On the other hand, in each of the respective tuning circuits for constituting the channel selecting circuit, the required variable capacitance range, that is, the required ratio of the maximum capacitance to the minimum capacitance is determined as follows: the capacitance ratio of the antenna tuning circuit and that of the high frequency tuning circuit are roughly the same with respect to each other; the capacitance ratio of the local oscillation tuning circuit of upper side heterodyne system is smaller than that of both the antenna tuning circuit and the high frequency tuning circuit; and the capacitance ratio of the local oscillation tuning circuit of lower side heterodyne system is larger than that of both the tuning circuits.

Therefore, irrespective of the capacitance value rankings of the variable capacitance diodes, as far as the variable capacitance ratio of the respective tuning circuits can be always set to a predetermined value, respectively, it is possible to obtain such the conditions that when the tracking adjustment is effected at a frequency, no tracking error occurs at the other frequencies.

By the way, in the turning circuit, the following relationship can be established among the maximum frequency $f_{max}$, the minimum frequency $f_{min}$, the maximum capacitance $C_{max}$ and the minimum capacitance $C_{min}$ on condition that the coil inductance is kept constant, irrespective of change in frequency:

$$f_{max}/f_{min} = (C_{max}/C_{min})^{1/2} \quad (1)$$

Here, since each of the maximum capacitance $C_{max}$ and the minimum capacitance $C_{min}$ is a synthesized capacitance of the variable capacitance diode and the fixed capacitance, the following relationship can be established:

$$(C_{max}/C_{min}) = (C_{vmax} + C_s)/(C_{vmin} + C_s) \quad (2)$$

where $C_{vmax}$ and $C_{vmin}$ denote the maximum and minimum capacitance values of the variable capacitance diode, respectively and $C_s$ denotes the fixed capacitance value.

In the case of the antenna tuning circuit, $C_{vmax}$ and $C_{vmin}$ correspond to the maximum capacitance and the minimum capacitance obtained by the two series-connected variable capacitance diodes D1 and D2, and $C_s$ corresponds to the capacitance of the fixed capacitor C1. Further, $f_{max}$ and $f_{min}$ correspond to the maximum frequency 90 MHz and the minimum frequency 76 MHz of the reception frequencies.

Accordingly, as understood apparently from the expression (2), even if the maximum capacitance $C_{vmax}$ and the minimum capacitance $C_{vmin}$ differ due to the ranking of the variable capacitance diodes, when the capacitance value $C_s$ of the fixed capacitance is changed for each ranking, it is possible to make constant the variable capacitance range or the variable capacitance ratio (i.e., $C_{max}/C_{min}$) at a constant value.

Further, the maximum capacitance $C_{vmax}$ of the variable capacitance diode is obtained when the used tuning voltage is the minimum, and the minimum capacitance $C_{vmin}$ of the variable capacitance diode is obtained when the used tuning voltage is the maximum, respectively.

Therefore, the capacitance values of the variable capacitance diode obtained when the tuning voltage is the minimum and the maximum are substituted for the maximum capacitance $C_{vmax}$ and the minimum capacitance $C_{vmin}$ of the expression (2). In this case, since the variable capacitance diodes are classified into some rankings, it is preferable to substitute the central capacitance value of the ranked capacitance range for the above maximum and minimum values.

For instance, since the variable capacitance diode No. [KV1410] has the maximum capacitance $C_{vmax}$ at the tuning voltage of 2V, when the first rank is selected, a central capacitance value of 41.96 PF of the first rank is substituted therefor. The same can be applied to the minimum capacitance value $C_{vmin}$.

In each tuning circuit of the antenna tuning circuit, the high frequency tuning circuit and the local oscillation tuning circuit, although the necessary variable capacitance range or ratio ($C_{max}/C_{min}$) is set in order to eliminate the tracking error, the capacitance value $C_s$ of the fixed capacitance is adjusted according to the ranking of the variable capacitance diode in such a way that the determined variable capacitance range or ratio ($C_{max}/C_{min}$) can be obtained for each tuning circuit.

Further, in the case where another capacitance exerting a harmful influence upon the tuned frequency exists on the circuit board, other than the capacitance formed integral as a block, the capacitance value within the block is adjusted so that the variable capacitance range or ratio ($C_{max}/C_{min}$) can be determined at a constant, including the capacitance value of the capacitance (e.g., the stray capacitance) other than the fixed capacitance.

Figure 5:
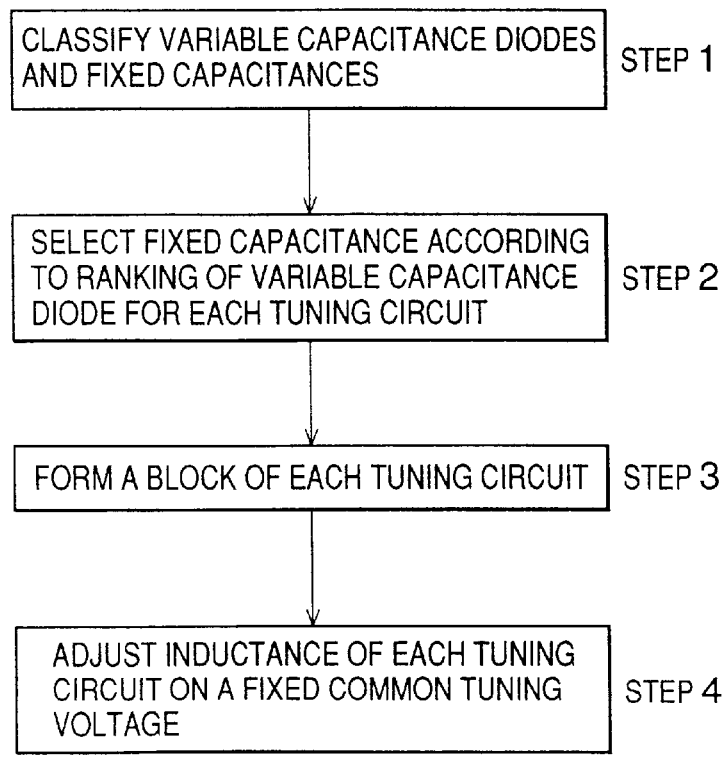
FIG. 5 is a flowchart for assistance in explaining the manufacturing process of each of the respective tuning circuits for constituting the high frequency channel selecting circuit for the radio receiver according to the present invention.

The method of manufacturing the respective tuning circuits for constituting the high frequency channel selecting circuit according to the present invention will be described hereinbelow with reference to FIG. 5. The essential features of the manufacturing method according to the present invention are (1) to eliminate the tracking error by use of one common tuning voltage, and (2) to connect the fixed capacitance to each tuning circuit in such a way that a predetermined variable capacitance range or ratio ($C_{max}/C_{min}$) can be obtained for each tuning circuit according to the ranking of the variable capacitance diode.

In practice, in order to obtain a predetermined variable capacitance range or ratio ($C_{max}/C_{min}$) for each tuning circuit, it is possible to decide the capacitance value of the fixed capacitance according to the ranking of the variable capacitance diode, previously at the empirical stage or the design stage. Accordingly, in practice, it is effective to manufacture the tuning circuit in accordance with the flowchart as shown in FIG. 5.

First, the variable capacitance diodes are classified for each necessary ranking, and further the fixed capacitances are also classified for each necessary capacitance value. Here, since the fixed capacitance can be classified in accordance with the general International Standard E24 series and the variable capacitance diodes can be classified in accordance with the ordinary classification method, the variable capacitance diodes and the fixed capacitances can be both classified easily whenever purchased (in Step 1).

Further, the fixed capacitance is selected according to the ranking of the variable capacitance diode for each tuning circuit (in Step 2).

After that, the variable capacitance diodes, the fixed capacitance selected according to the ranking of the variable capacitance diodes, and the coil are all joined together to form a block of the tuning circuit. By doing this, it is possible to obtain a predetermined variable capacitance range or ratio ($C_{max}/C_{min}$) for each tuning circuit in the common tuning voltage range (in Step 3).

After that, the inductance of each tuning circuit is adjusted on the basis of one common tuning voltage so that no tracking error occurs (in Step 4). As a result, the range of the tuning voltage can be set to a range for covering the reception band of the radio receiver.

Here, the inductance can be adjusted simultaneously after the antenna tuning circuit, the high frequency tuning circuit and the local oscillation tuning circuit are all mounted on the adjusting board or after any one of these three tuning circuits has been mounted on the adjusting board separately. Further, the above steps 2 and 3 may be seen as a single step.

In the channel selecting circuit assembled by mounting the antenna tuning circuit, the high frequency tuning circuit and the local oscillation tuning circuit on the circuit board of the radio receiver as described above, it is possible to minimize the tracking error all over the reception band of the radio receiver, without adjusting any coil inductances of the three tuning circuits.

Figure 6:
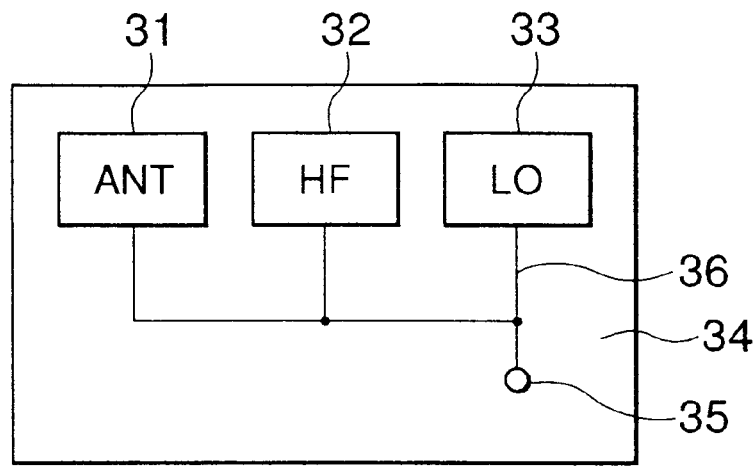
FIG. 6 is a connection diagram of the high frequency channel selecting circuit according to the present invention.

In addition, the channel selecting circuit according to the present invention assembled on the circuit board as shown in FIG. 6, it is possible to minimize the tracking error when the inductances are adjusted on the basis of one common tuning voltage. In FIG. 6, the antenna tuning circuit 31, the high frequency tuning circuit 32 and the local oscillation tuning circuit 33 are mounted on the circuit board 34 and further connected to a terminal 35 to which the common tuning voltage is applied. Further, although other circuit elements for constituting the radio receiver are also mounted on the circuit board 34, only the circuit elements related to the channel selecting circuit are shown in FIG. 6.

Figure 7:
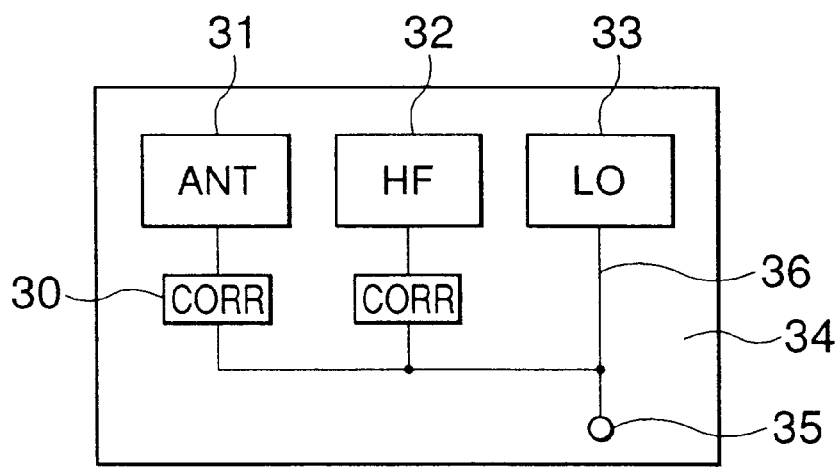
FIG. 7 is the other connection diagram of the high frequency channel selecting circuit according to the present invention.

Without being limited only to the connection as shown in FIG. 6, however, it is also possible to apply the tuning voltage to both the antenna tuning circuit 31 and the high frequency tuning circuit 32 via a correction circuit 30, respectively, while directly applying the tuning voltage only to the local oscillation tuning circuit 33 controlled by a PLL (phase locked loop) circuit, as shown in FIG. 7. In the connection embodiment as shown in FIG. 7, since the tuning voltage can be applied to both the antenna tuning circuit 31 and the high frequency tuning circuit 32, respectively by adjusting the tuning voltage finely, it is possible to eliminate the tracking error almost perfectly.

In general, the correcting circuit 30 is controlled by use of a micro-computer. In the case of the high frequency channel selecting circuit according to the present invention which requires no inductance adjustment after mounted on the circuit board, in particular, these two correcting circuits 30 can be effectively utilized. Here, the method of finely adjusting the tuning voltage applied to the antenna tuning circuit, the high frequency tuning circuit and the local oscillation tuning circuit by use of the computer-controlled correcting circuit, respectively is disclosed in Japanese Published Unexamined (Kokai) Patent Application No. 3-145339, for instance. However, the effect of the disclosed method seems to be not yet satisfactory. This is because in the computer-controlled correcting circuit used in the disclosed channel selecting circuit, although the tuning voltage can be adjusted finely, it is rather difficult to control the tuning voltage in a relatively wide range, with the result that the correcting circuits cannot be operative effectively. In contrast with this, in the channel selecting circuit according to the present invention, since the tracking error has been already reduced extremely small on the basis of the common tuning voltage, it is possible to make the best use of the effect of the correcting circuits 30, when applied to the channel selecting circuit according to the present invention. Further, in the above-mentioned embodiment, although the fixed capacitance formed integral as a block is one, there exists the case where a plurality of fixed capacitances each for exerting an influence upon the tracking are formed according to the circuit construction. In this case, any one of the fixed capacitances which exerts the most serious influence upon the tracking is formed integral as a block, or else the block is formed by including a plurality of the other fixed capacitances.

As described above, in the high frequency channel selecting circuit for a radio receiver according to the present invention, since each of the tuning circuits is formed as a single block and further since the circuit elements formed as the block are connected by use of the adjusting board or the circuit board, it is possible to prevent the antenna tuning circuit, the high frequency tuning circuit and the local oscillation tuning circuit from being interfered with each other, with the result that the circuit elements can be arranged without any restriction and thereby the degree of design freedom can be improved. This is particularly important when a high-frequency FM radio receiver is designed.

Further, in the method of manufacturing the tuning circuits for constituting the channel selecting circuit according to the present invention, since the capacitance value of the fixed capacitance is selected in such a way that a predetermined variable capacitance range or a ratio ($C_{max}/C_{min}$) for each tuning circuit can be obtained according to the ranking of the capacitance values of the variable capacitance diodes and further since only one common tuning voltage is used to eliminate the tracking error, even if there exists a dispersion of the capacitance values of the variable capacitance diodes due to a difference between the capacitance rankings, when the respective tuning circuits are mounted on the circuit board and assembled as the high frequency channel selecting circuit, it is possible to eliminate any complicated inductance adjustments. As a result, it is possible to obtain such an important effect that the tracking adjustment can be facilitated markedly.

In addition, since the rankings of the variable capacitance diodes are not restricted, all the variable capacitance diodes of all the rankings can be used without waste, so that there exists an economical effect.

Further, recently, the tracking adjustment is executed by use of the computer-controlled voltage correcting circuit for each tuning circuit as explained with reference to FIG. 7, and an IC of this type is now being developed. In this case, since the tracking error can be previously reduced extremely small by use of the tuning circuit blocks according to the present invention, when the tuning voltage correcting circuits are additionally used, it is possible to adjust the tracking much more accurately.

What is claimed is:

1. A high frequency channel selecting circuit for radio receiver, comprising an antenna tuning circuit, a high frequency tuning circuit, and a local oscillation tuning circuit, wherein:

each of said tuning circuits includes a coil having an inductance, at least one diode having a capacitance which is variable in response to a tuning voltage, and a capacitor having a fixed capacitance, said diode and said capacitor being united as a block to form a circuit having a resonant characteristic;

in each of said tuning circuits, the capacitance of the diode is within any ranking and the fixed capacitance of the capacitor has a value determined by the ranking of the diode to obtain a determined variable capacitance ratio;

in each of said tuning circuits, the coil inductance is adjusted to a value which minimizes tracking errors when a tuning voltage having a given common value is applied to the diode; and all of said tuning circuits are mounted on a common circuit board.

2. The high frequency channel selecting circuit of claim 1, wherein the respective tuning circuit blocks are controlled by a single common tuning voltage in a reception band of the radio receiver.

3. The high frequency channel selecting circuit of claim 1, wherein the antenna tuning circuit block and the high frequency tuning circuit block are both controlled by two tuning voltages different from the tuning voltage applied to the local oscillation tuning circuit block, the two tuning voltages being obtainable through two correcting circuits controlled by a micro-computer, respectively in a reception band of the radio receiver.

4. The high frequency channel selecting circuit of claim 1, wherein the variable capacitance ratio determined for each tuning circuit block is a variable capacitance ratio of the maximum capacitance value to the minimum capacitance value of the tuning circuit block.

5. The high frequency channel selecting circuit of claim 4, wherein the maximum capacitance value of the tuning circuit block is a sum of a maximum capacitance value of the variable capacitance diode and a capacitance value of the fixed capacitance, and the minimum capacitance value of the tuning circuit block is a sum of a minimum capacitance value of the variable capacitance diode and the capacitance value of the fixed capacitance.

6. A method of manufacturing an antenna tuning circuit, a high frequency tuning circuit and a local oscillation tuning circuit, all for constituting a high frequency channel selecting circuit for a radio receiver, wherein each tuning circuit is formed as a block composed of a coil having an adjustable inductance, at least one diode having a capacitance which is variable in response to a tuning voltage, and a capacitor having a fixed capacitance, which method comprises constructing each tuning circuit by the steps of:

individually selecting as the at least one diode, a diode having a capacitance value ranking which is one of a plurality of rankings;

individually selecting, as the capacitor having a fixed capacitance, a capacitor having a capacitance value which is dependent on the ranking of the selected diode;

connecting the coil, the at least one diode and the capacitor together as a block to form the respective tuning circuit; and adjusting the coil inductance to minimize tracking errors when a tuning voltage having a given value, common to all tuning circuits, is applied to the diode; whereby the diode and the capacitor are selected to give the tuning circuit a determined variable capacitance ratio.

7. The method of claim 6 comprising the further step of mounting the antenna tuning circuit, the high frequency tuning circuit and the local oscillation tuning circuit on a common substrate.

8. The method of claim 7 wherein the diode selected for one of the tuning circuits has a capacitance value ranking different from that of the diode selected for another of the tuning circuits.

9. A method for manufacturing a high frequency channel selecting circuit for a radio receiver comprising an antenna tuning circuit, a high frequency tuning circuit, and a local oscillation tuning circuit, each of said tuning circuits being formed using a coil, a variable capacitance diode and a fixed capacitor, said method comprising a) forming tuning circuits by the steps of:
(i) selecting a special rank of variable capacitance diodes from groups of variable capacitance diodes classified into ranks according to characteristics of variable capacitance diodes;
(ii) preparing groups of fixed capacitors having values according to the ranks which are set to obtain variable capacitance ratio for the respective tuning circuits;
(iii) preparing groups of tuning coils;
(iv) making tuning circuit blocks unitizing said groups of variable capacitance diodes, said groups of fixed capacitors and said groups of coils; and
(v) adjusting the inductances of said coils in said tuning circuits by applying a voltage common to said respective tuning circuits; and (b) combining an antenna tuning circuit, a high frequency tuning circuit and a local oscillation tuning circuit together so as to form a high frequency channel selecting circuit.

* * * * *